US006777695B2

(12) United States Patent
Viviani

(10) Patent No.: US 6,777,695 B2
(45) Date of Patent: Aug. 17, 2004

(54) ROTATING BEAM ION IMPLANTER

(75) Inventor: Gary L. Viviani, Boxford, MA (US)

(73) Assignee: Varian Semiconductors Equipment Associates, Inc., Gloucester, MA (US)

(*) Notice: Subject to any disclaimer, the term of this patent is extended or adjusted under 35 U.S.C. 154(b) by 0 days.

(21) Appl. No.: 10/299,935

(22) Filed: Nov. 19, 2002

(65) Prior Publication Data

US 2004/0007679 A1 Jan. 15, 2004

Related U.S. Application Data

(60) Provisional application No. 60/395,750, filed on Jul. 12, 2002.

(51) Int. Cl.[7] ................................................ H01J 37/00
(52) U.S. Cl. ............................ 250/492.21; 250/442.11; 313/360.1; 285/114
(58) Field of Search .................. 250/492.21, 442.11, 250/447.11, 397, 398, 453.1; 313/360.1; 285/114; 315/111.81; 403/51, 50

(56) References Cited

U.S. PATENT DOCUMENTS

| | | | |
|---|---|---|---|
| 3,778,626 A | 12/1973 | Robertson | |
| 4,449,051 A | 5/1984 | Berkowitz | |
| 4,922,106 A | 5/1990 | Berrian et al. | |
| 5,130,552 A | 7/1992 | Bright et al. | |
| 5,350,926 A | 9/1994 | White et al. | |
| 6,194,734 B1 | 2/2001 | Loomis et al. | |
| 6,207,959 B1 | * 3/2001 | Satoh et al. ............ | 250/442.11 |

FOREIGN PATENT DOCUMENTS

| | | |
|---|---|---|
| JP | 05128997 | 5/1993 |
| JP | 09245722 | 9/1997 |
| JP | 11126577 | 5/1999 |
| JP | 11339706 | 12/1999 |
| JP | 11339711 | 12/1999 |

OTHER PUBLICATIONS

Seki et al,"Ion Implantation Equipment and Implantation Method Thereof", Pub. No. US 2001/0013578 A1, publication date: Aug. 16, 2001.*
Won–Ju–Kim, "Ion Implanter", Pub. No. US 2002/0180366 A1, publication date: Dec. 2, 2002.*
"Properties of Symmetric Qradrupole Magnet Triplets", K.L. Brown and A.C. Hindmarsh, Technical Report, Office of Technical Services, Aug. 1965, pp. 1–46.

* cited by examiner

Primary Examiner—John R. Lee
Assistant Examiner—Zia R. Hashmi

(57) ABSTRACT

Methods and apparatus are provided for ion implantation of a workpiece. The apparatus includes an ion beam generator for generating an ion beam, a deflection device for deflecting the ion beam to produce a deflected ion beam, and a drive device for rotating the deflection device about an axis of rotation to thereby cause the deflected ion beam to rotate about the axis of rotation and to produce a rotating ion beam. The apparatus may include a controller for controlling the deflection and/or the rotation of the ion beam to produce a desired distribution of the ion beam over the surface of the workpiece. The apparatus may further include an angle compensation device for causing the rotating ion beam to have a substantially constant angle of incidence on the workpiece.

42 Claims, 7 Drawing Sheets

ROTATING BEAM ION IMPLANTER

CROSS REFERENCE TO RELATED APPLICATION

This application claims the benefit of provisional application Serial No. 60/395,750, filed Jul. 12, 2002, which is hereby incorporated by reference in its entirety.

FIELD OF THE INVENTION

This invention relates to system and methods for ion implantation of dopant materials into semiconductor wafers and other workpieces and, more particularly, to systems and methods for implanting workpieces with a rotating ion beam.

BACKGROUND OF THE INVENTION

Ion implantation has become a standard technique for introducing conductivity-altering impurities into semiconductor wafers. A desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

A well-known trend in the semiconductor industry is toward smaller, higher speed devices. In particular, both the lateral dimensions and the depths of features in semiconductor devices are decreasing. State of the art semiconductor devices require junction depths less than 1000 Angstroms and may eventually require junction depths on the order of 200 Angstroms or less.

The implanted depth of the dopant material is determined, at least in part, by the energy of the ions implanted into the semiconductor wafer. Shallow junctions are obtained with low implant energies. However, ion implanters are typically designed for efficient operation at relatively high implant energies, for example in the range of 50 keV to 400 keV, and may not function efficiently at the energies required for a shallow junction implantation. At low implant energies, such as energies of 2 keV and lower, the ion current delivered to the wafer is much lower than desired and in some cases may be near zero. As a result, extremely long implant times may be required to achieve a specified dose, and throughput is adversely affected. Such reduction in throughput increases fabrication costs and is unacceptable to semiconductor device manufacturers.

Another trend in ion implanters is toward single wafer implanters, wherein one wafer at a time is implanted. Batch implanters have been utilized to achieve high throughput, but are large and expensive and place multiple, highly expensive wafers at risk.

One approach to single wafer ion implantation employs a so-called ribbon ion beam. The ribbon ion beam has a width that is at least as great as the diameter of the wafer, and the wafer is mechanically moved in a direction perpendicular to the long dimension of the ribbon beam cross section to distribute the ions over the wafer surface. This approach provides highly satisfactory performance but suffers from certain drawbacks. In particular, the ribbon beam is required to be highly uniform across its width. Compensation components and adjustment procedures are required to provide a uniform beam over a range of beam parameters.

Another well-known approach to single wafer ion implantation employs one-dimensional scanning of the ion beam and mechanical movement of the wafer in a direction perpendicular to the beam scan direction. Yet another approach to single wafer ion implantation employs two-dimensional scanning of the ion beam over the wafer surface. These approaches provide highly satisfactory performance but have drawbacks, including reduced levels of performance at ultralow implant energies.

Accordingly, there is a need for new and improved methods and apparatus for ion implantation of workpieces, such as semiconductor wafers.

SUMMARY OF THE INVENTION

According to a first aspect of the invention, apparatus is provided for ion implantation of a workpiece. The apparatus comprises an ion beam generator for generating an ion beam, a deflection device for deflecting the ion beam to produce a deflected ion beam, and a drive device for rotating the deflection device about an axis of rotation to thereby cause the deflected ion beam to rotate about the axis of rotation and to produce a rotating ion beam.

In some embodiments, the deflection device comprises a magnet having polepieces disposed on opposite sides of the ion beam and a magnet winding. A power source supplies a controllable current to the magnet winding. In other embodiments, the deflection device comprises an electrostatic deflection device.

The apparatus may further comprise a controller coupled to the deflection device for controlling deflection of the ion beam. The controller may include means for varying the deflection of the ion beam to thereby cause the rotating ion beam to be distributed over the surface of the workpiece. The controller may comprise means for moving the rotating ion beam in a pattern of concentric annular rings. In other embodiments, the controller includes means for moving the rotating ion beam in a spiral pattern. The controller may further comprise means coupled to the drive device for controlling the rotation of the deflected ion beam. The rotation of the deflected ion beam may be controlled to produce a desired distribution of the ion beam over the surface of the workpiece.

The apparatus may further comprise an angle compensation device for causing the rotating ion beam to have a substantially constant angle of incidence on the workpiece as the deflected ion beam is rotated about the axis of rotation. In some embodiments, the angle compensation device comprises a magnetic lens for directing the rotating ion beam along parallel trajectories. In other embodiments, the angle compensation device comprises an angle corrector magnet and a drive mechanism for rotating the angle corrector magnet about the axis of rotation in synchronism with the rotating ion beam. In further embodiments, the angle compensation device comprises a mechanism for tilting the workpiece in synchronism with the rotating ion beam. In further embodiments, the angle compensation device comprises an electrostatic lens for directing the rotating ion beam along parallel trajectories.

According to another aspect of the invention, a method is provided for ion implantation of a workpiece. The method comprises generating an ion beam, deflecting the ion beam to produce a deflected ion beam, and rotating the deflected ion beam about an axis of rotation to produce a rotating ion beam.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
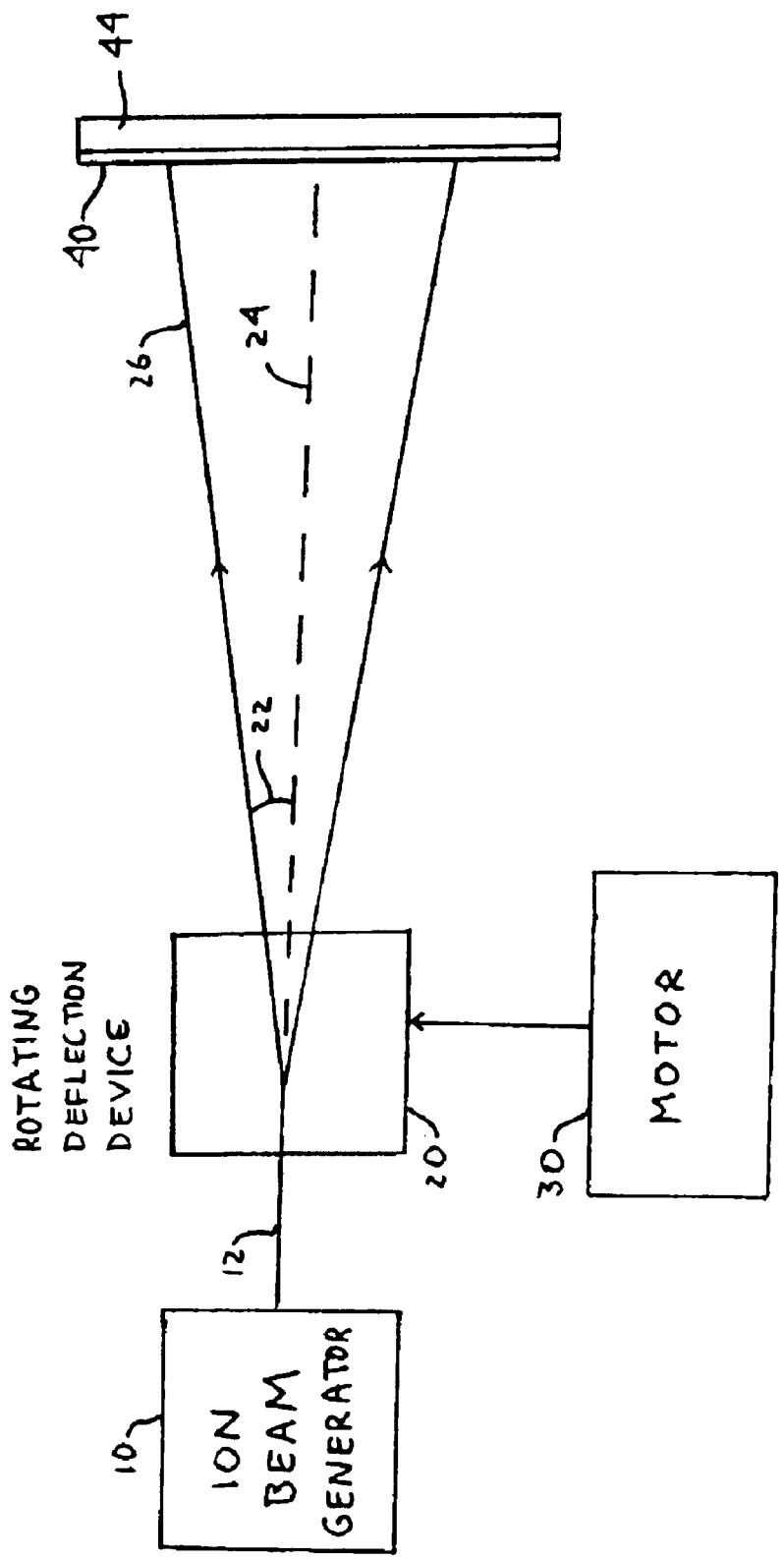
FIG. 1 is a schematic block diagram of ion implantation apparatus in accordance with a first embodiment of the invention.

A schematic block diagram of ion implantation apparatus in accordance with a first embodiment of the invention is shown in FIG. 1. An ion beam generator 10 generates an ion beam 12. Ion beam generator 10 may include an ion source for ionizing a selected dopant material and producing a well-defined ion beam, a mass analyzer for selecting a desired dopant species from the ion beam and an accelerator for accelerating the selected ion species to a desired energy. Ion beam generators for generating a well-defined ion beam of a desired species and energy are known to those skilled in the art.

Figure 3:
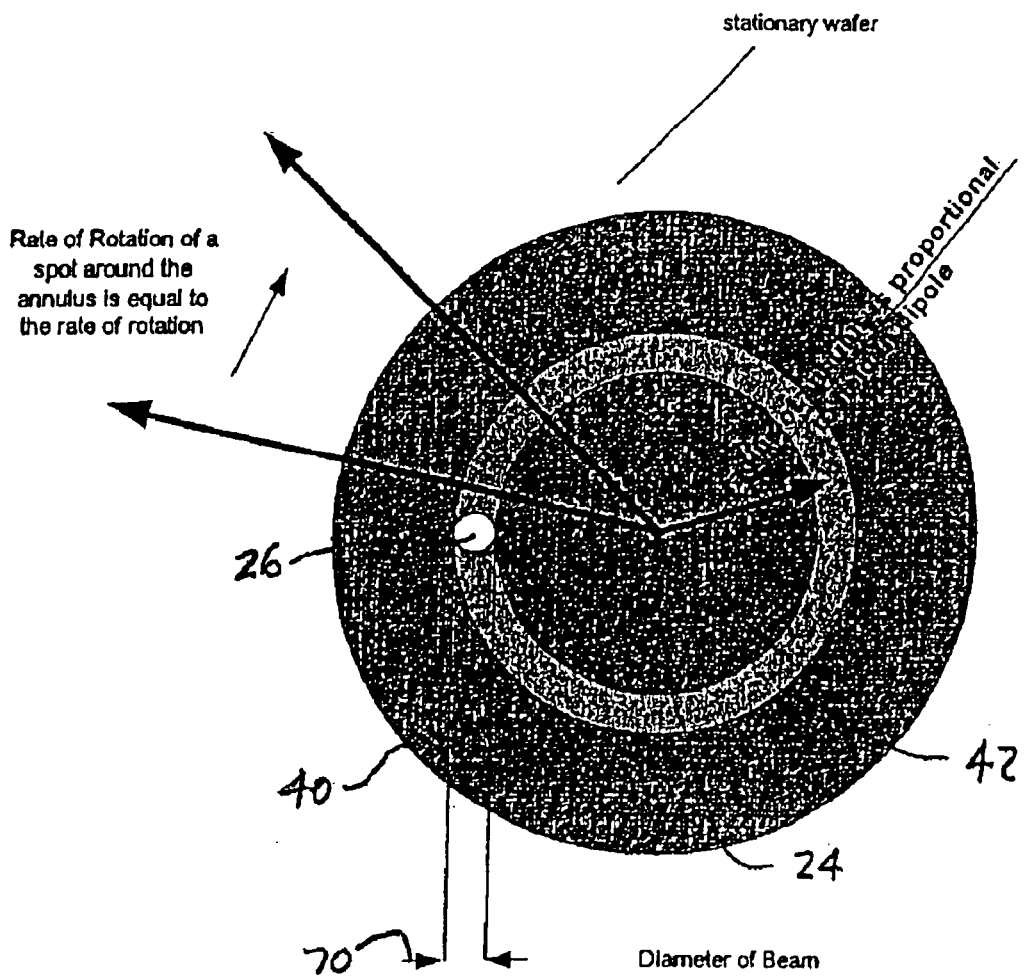
FIG. 3 illustrates an annular ring scanned by the rotating ion beam on a semiconductor wafer.

The ion beam 12 is transported through a rotating deflection device 20 which deflects ion beam 12 by a deflection angle 22 with respect to an axis 24 to produce a deflected ion beam 26. Axis 24 may correspond to the undeflected beam direction. As described below, the deflection angle 22 may vary with time. The deflection device 20 may be a magnetic device or an electrostatic device. In a preferred embodiment, deflection device 20 is a magnetic device as described below. A drive device, such as a motor 30, is mechanically coupled to deflection device 20 and produces rotation of deflection device 20 about axis 24. As a result, deflected ion beam 26 rotates about axis 24 to produce a rotating ion beam 32. The rotating ion beam 32 is incident on a workpiece, such as a semiconductor wafer 40. As shown in FIG. 3, rotating ion beam 32 scans an annular ring 42 on wafer 40. Wafer 40 is stationary in the embodiment of FIG. 1. A platen 44 supports wafer 40 or other workpiece in the path of rotating ion beam 32. Platen 44 may be a cooled electrostatic wafer clamp, as described for example in U.S. Pat. No. 5,452,177 issued Sep. 19, 1995 to Frutiger.

In some embodiments, axis 24 of rotating ion beam 32 passes through the center of wafer 40. In other embodiments, axis 24 of rotating ion beam 32 is displaced from the center of wafer 40.

Figure 2:
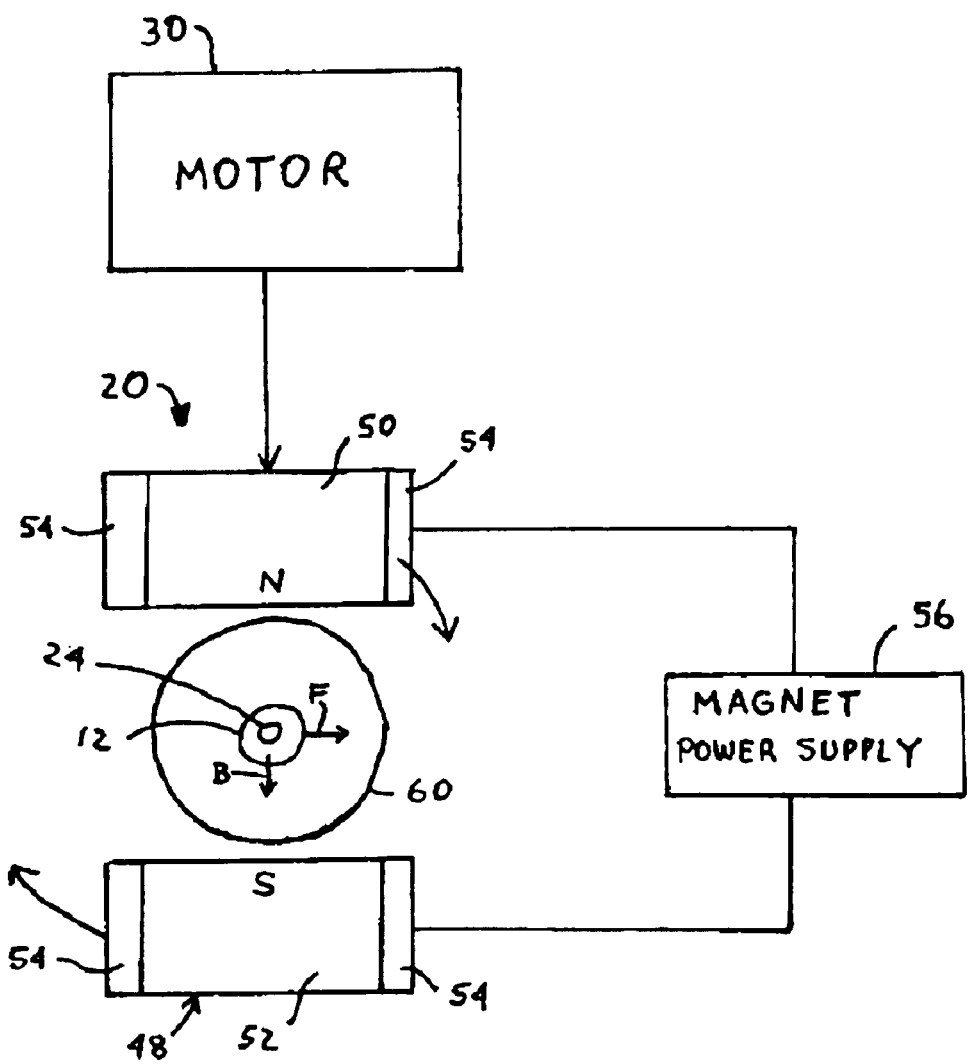
FIG. 2 is a schematic diagram of an embodiment of the deflection device shown in FIG. 1, as viewed along the axis of rotation.

An embodiment of deflection device 20 is shown in FIG. 2, as viewed along axis 24. In the embodiment of FIG. 2, deflection device 20 is a dipole deflection magnet 48 including polepieces 50 and 52, disposed on opposite sides of ion beam 12, and a magnet winding 54 for energizing polepieces 50 and 52. The apparatus further includes a magnet power supply 56 electrically connected to magnet winding 54. Polepieces 50 and 52 and magnet winding 54 are mechanically coupled to motor 30 for rotation about axis 24. Preferably, components of the deflection magnet 48 are located externally of a vacuum housing 60 through which ion beam 12 is transported.

As known to those skilled in the art, the deflection magnet produces a magnetic field B in a region between polepieces 50 and 52, and a deflection force F is applied to ion beam 12 in a direction that is perpendicular to magnetic field B and to the direction of beam transport. The force F deflects the ion beam to produce deflected ion beam 26. The motor 30 causes the polepieces 50 and 52 and the magnet winding 54 to rotate about axis 24, thereby causing the deflected ion beam to rotate about axis 24 and to produce rotating ion beam 32, as shown in FIG. 1. During each rotation of deflection magnet 48 about axis 24, rotating ion beam 32 traces a conical beam envelope.

FIG. 3 shows semiconductor wafer 40 as viewed along axis 24. The rotating ion beam 32 scans annular ring 42 on wafer 40. Annular ring 42 represents an area of wafer 40 on which rotating ion beam 32 is incident. Annular ring 42 is centered on axis 24 and has a radius that is a function of deflection angle 22 (FIG. 1) and the distance between deflection device 20 and wafer 40. By adjusting deflection angle 22 and/or the distance between deflection device 20 and wafer 22, the radius of annular ring 42 is adjusted. The radial dimension of annular ring 42 corresponds to a diameter of deflected ion beam 26 at the point where it is incident on wafer 40.

The number of ions implanted into wafer 40 per unit area depends on the ion density in rotating ion beam 32 and the speed of rotating ion beam 32 relative to wafer 40. As described below, rotating ion beam 32 can be distributed over the surface of wafer 40 by varying the deflection angle 22 and thereby varying the radius of annular ring 42. For example, the radius of annular ring 42 can be varied in steps to produce a number of annular rings of different radii. If the radius of annular ring 42 is varied from a small value or zero to the radius of wafer 40, the rotating ion beam 32 produces a circular implant pattern and is distributed over the entire surface of wafer 40. In other embodiments, the radius of annular ring 42 is varied from a first value to a second value, thus producing an annular implant pattern. The annular rings may have abutting edges or may overlap to some extent to ensure that the ion beam is distributed over the surface of wafer 40. In one approach, the number of rotations of deflected beam 26 about axis 24 at each deflection angle may be controlled to achieve a desired dose distribution. In another approach, the angular speed of rotation may be controlled as a function of deflection angle to achieve a desired dose distribution over the surface of wafer 40. In particular, the rotation speed may be decreased for larger values of the radius of annular ring 42 to ensure dose uniformity. However, it may be difficult to rapidly change the rotation speed of a deflection device having a large mass. It will be understood that a combination of variable rotation speed and a variable number of rotations may be utilized to achieve a desired dose distribution. Typical ion implantation applications require uniform dose distribution over the surface of wafer 40.

In the embodiment of FIG. 1, rotating ion beam 32 has a variable incidence angle with respect to the crystal structure of wafer 40. In some applications of the ion implantation apparatus, the variable incidence angle may be acceptable. However, ion implantation of semiconductor wafers typically requires a constant angle of incidence of the ion beam on the wafer as the beam is distributed over the wafer due to the crystal structure of the semiconductor wafer and due to process requirements. The ion beam may be normal to the wafer or may be oriented at a specified tilt angle.

Figure 4:
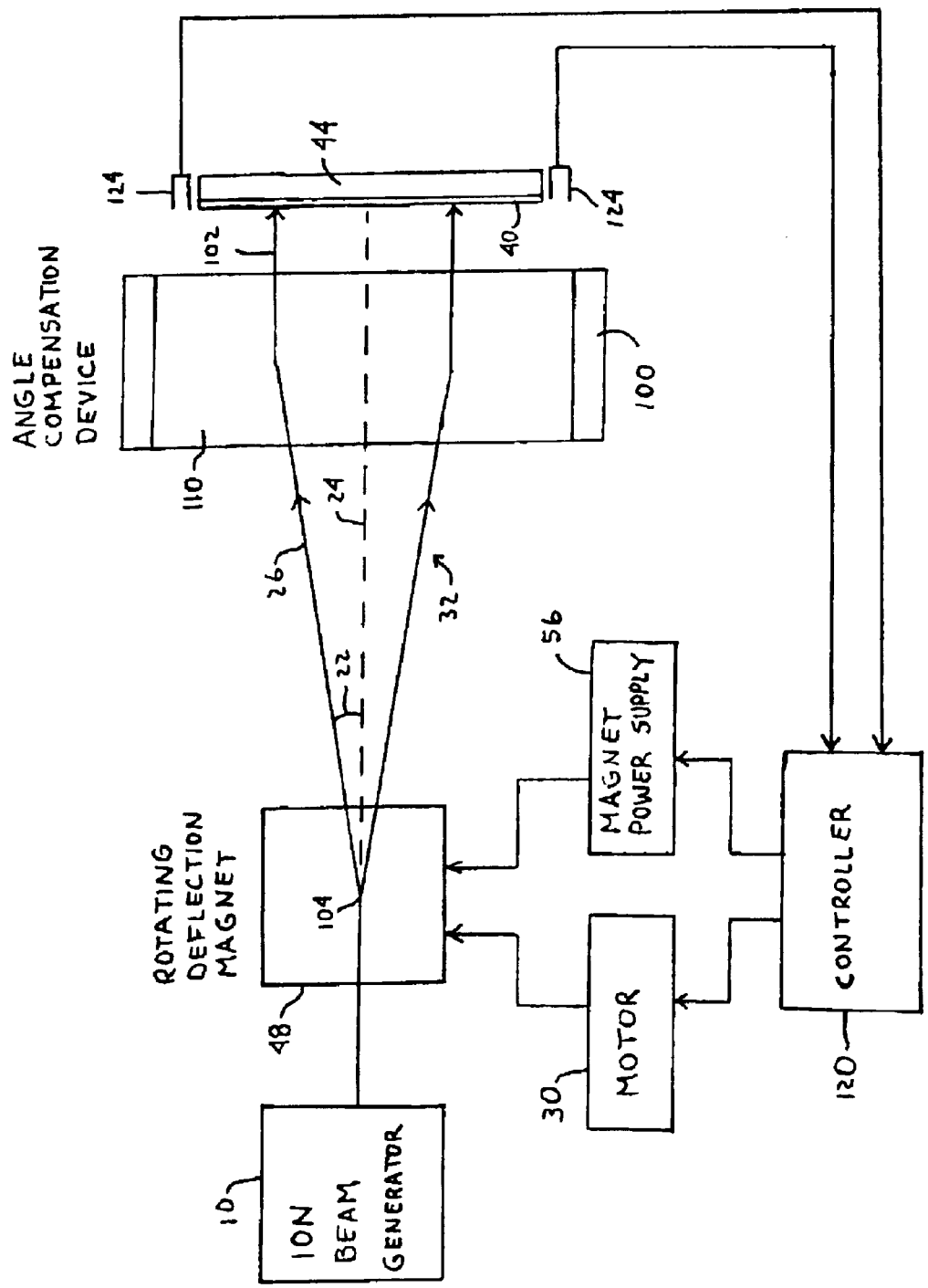
FIG. 4 is a schematic block diagram of ion implantation apparatus in accordance with a second embodiment of the invention.

A schematic block diagram of ion implantation apparatus in accordance with a second embodiment of the invention is shown in FIG. 4. The ion implantation apparatus of FIG. 4 is configured to distribute the rotating ion beam over the surface of wafer 40 and to produce a substantially constant angle of incidence of the rotating ion beam on wafer 40. Like elements in FIGS. 1–4 have the same reference numerals.

The ion implantation apparatus of FIG. 4 includes an angle compensation device 100 positioned between rotating deflection magnet 48 and wafer 40. The angle compensation device 100 converts the diverging trajectories of rotating ion beam 32 to parallel or nearly parallel trajectories, such that a rotating beam 102 having parallel or nearly parallel trajectories is incident on wafer 40. Wafer 40 may be oriented normal to parallel rotating ion beam 102 or may be tilted at a desired angle. In either case, the incidence angle of rotating ion beam 102 on wafer 40 is constant over the wafer surface. The angle compensation device 100 functions as a collimating ion optical lens. Thus, if a center of deflection 104 of rotating ion beam 32 is located at the focal point of the ion optical lens, parallel ion trajectories are produced. The angle compensation device 100 can be a magnetic lens or an electrostatic lens. In the embodiment of FIG. 4, angle compensation device 100 is stationary and thus has an aperture 110 that is at least as large as the largest wafer 40 to be implanted. Wafer 40 is stationary in the embodiment of FIG. 4.

By way of example, angle compensation device 100 may be a point-to-parallel symmetric quadrupole magnet triplet, as described by K. L. Brown et al in "Properties of Symmetric Quadrupole Magnet Triplets", Technical Report prepared under contract AT(04-3)-400 for the USAEC, August 1965. In one embodiment, the quadrupole magnet triplet may have a conical configuration to more or less match the conical envelope of rotating ion beam 32 prior to collimation. In the conical configuration, the quadrupole magnets of the triplet have successively larger apertures. In another embodiment, the quadrupole magnet triplet may have a cylindrical configuration.

The ion implantation apparatus of FIG. 4 further includes a controller 120 for controlling the components of the ion implantation apparatus. Controller 120 may include a general purpose microcomputer and appropriate interface circuitry or a special purpose controller. Controller 120 controls the components of the ion implantation apparatus to distribute rotating ion beam 32 over the surface of wafer 40 with a desired ion dose and dose distribution.

Controller 120 may control magnet power supply 56 to vary the current supplied to rotating deflection magnet 48. The variable magnet current varies magnetic field B (FIG. 2), which in turn varies the angle 22 of deflected ion beam 26. Angle 22 may be varied from zero to a maximum angle that ensures dose uniformity to the outer periphery of wafer 40. In some embodiments, the maximum angle may be larger to direct the ion beam to one or more beam measuring devices, such as Faraday cups, located adjacent to the semiconductor wafer.

Controller 120 may also control motor 30 which rotates deflection magnet 48 to control the rotation speed of rotating ion beam 32. Thus, for example, the rotation speed may be controlled such that rotating ion beam 32 rotates relatively rapidly for small deflection angles and relatively slowly for large deflection angles to achieve dose uniformity of ions implanted into wafer 40. However, as noted above, it may be difficult to rapidly change the rotation speed when deflection device 20 has a relatively large mass.

The ion implantation apparatus may further include one or more beam measuring devices, such as Faraday cups 124, for measuring ion beam current. Each Faraday cup 124 may be connected to controller 120 for determining ion dose and dose uniformity. The Faraday cups may be arranged in an array. In some embodiments, ion beam current is measured with wafer 40 present in the apparatus. In these embodiments, a circular array of Faraday cups 124 may be positioned around the periphery of the wafer.

In other embodiments, ion beam current is measured with wafer 40 removed from the apparatus. In these embodiments, one or more circular arrays of Faraday cups 124 may be used. For example, two or more concentric circular arrays of Faraday cups 124 having different diameters may be used. In addition to or as an alternative to the circular arrays, one or more radial arrays of Faraday cups 124 may be used. For example, radial arrays of Faraday cups 124 arranged at 90° with respect to each other may be used. In further embodiments, moving Faraday cups may be utilized. A variety of ion dose and dose uniformity measurement techniques are known in the ion implanter art.

The controller 120 may calculate implanted dose and dose uniformity based on the measured ion current, the locations of the annular rings on wafer 40 (known from the programmed magnet current) and the rotation speed of rotating ion beam 32. Based on these calculations, the controller 120 may adjust one or all of the deflection angle 22, the rotation speed of rotating ion beam 32 and the implant time during an implant to achieve a desired uniformity. Thus, for example, if the calculated dose is lower near the outer periphery of wafer 40 than near the center, the number of ion beam rotations can be increased near the outer periphery. In another example, the controller 120 may adjust the rotation speed of each annular ring to achieve a desired dose uniformity.

Figure 5:
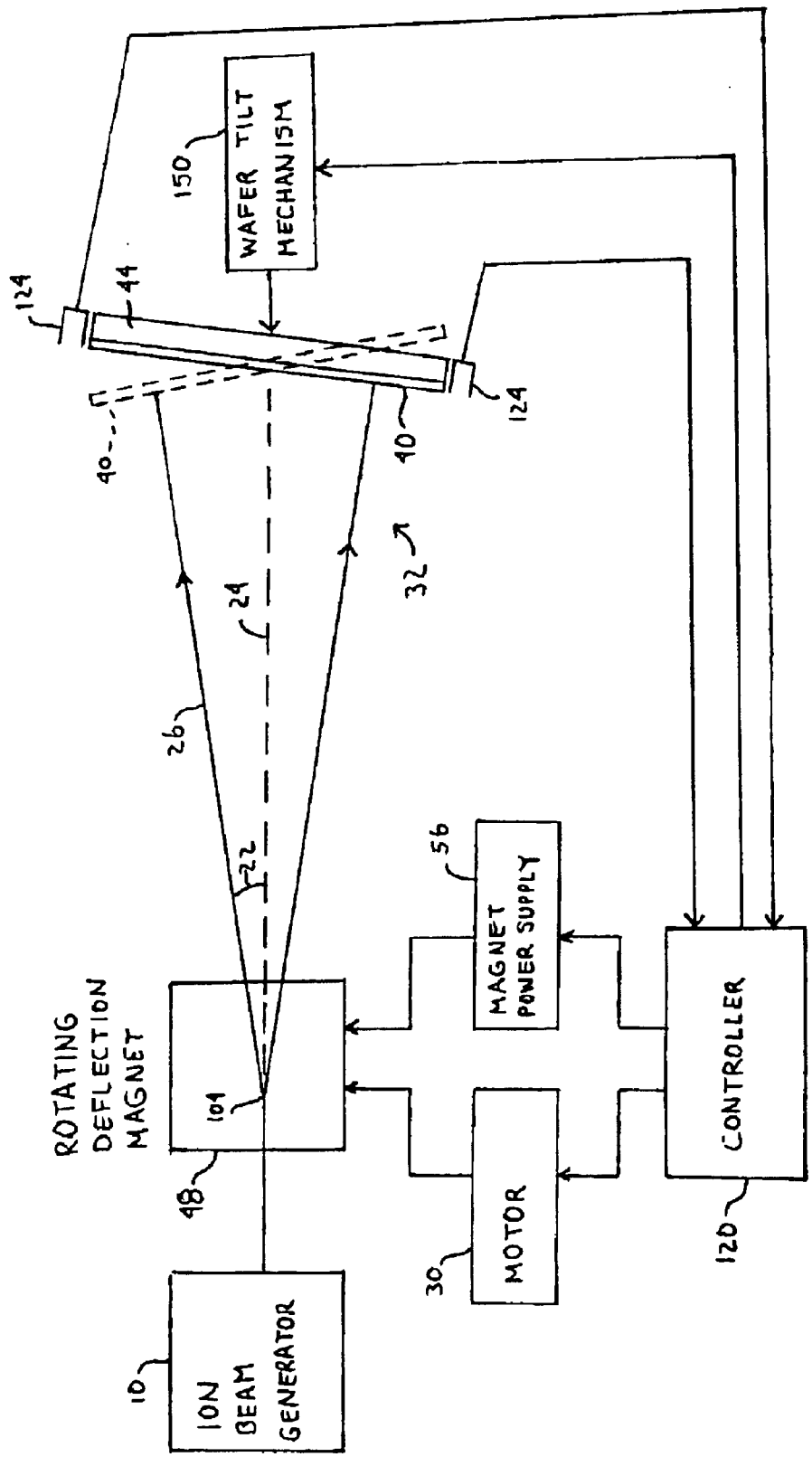
FIG. 5 is a schematic block diagram of ion implantation apparatus in accordance with a third embodiment of the invention.

A schematic block diagram of ion implantation apparatus in accordance with a third embodiment of the invention is shown in FIG. 5. Like elements in FIGS. 1–5 have the same reference numerals. In the embodiment of FIG. 5, a wafer tilt mechanism 150 functions as an angle compensation device. The wafer tilt mechanism 150 and the motor 30 are controlled by controller 30 so that wafer 40 is tilted in synchronism with the rotating ion beam 32 to achieve a constant angle of incidence of rotating ion beam 32 on wafer 40. Thus, the tilt of wafer 40 varies in direction during a single rotation of the rotating ion beam 32 and varies in magnitude as deflection angle 22 is varied. In the embodiment of FIG. 5, Faraday cup 124 may be tilted with the wafer 40 to ensure accurate ion beam measurement.

Figure 6A:
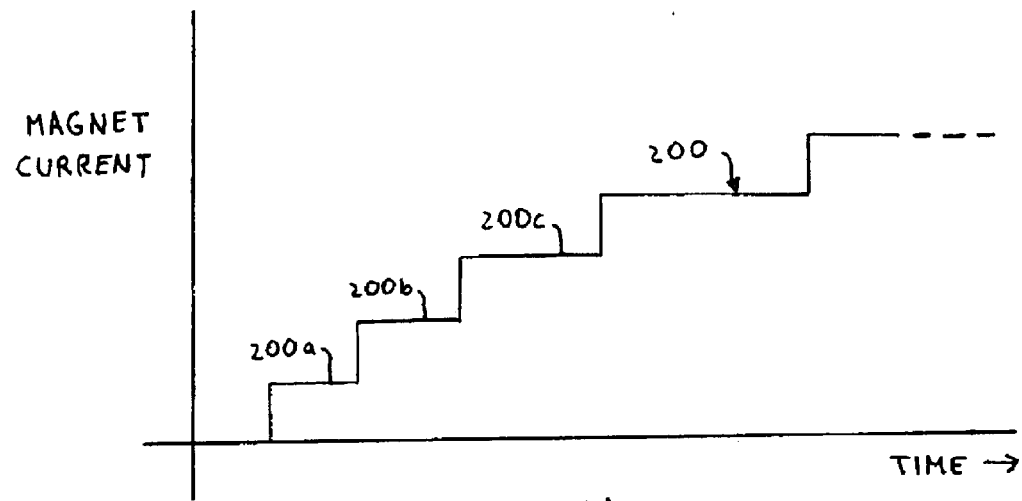
FIG. 6A is a graph of magnet current as a function of time, illustrating a magnet current waveform for moving the ion beam in a pattern of concentric annular rings.

A first example of deflection magnet current as a function of time to distribute rotating ion beam 32 over the wafer 40 is shown in FIG. 6A. In the example of FIG. 6A, a magnet current waveform 200 increases in steps as a function of time. Each step or value of magnet current corresponds to a different deflection angle 22 of rotating ion beam 32. The magnitude of the steps is selected to produce a series of concentric annular rings of different radii on wafer 40. The combination of annular rings may cover the entire surface of wafer 40. The amplitude of the steps in magnet current may be selected such that successive annular rings at least abut and preferably overlap to some extent. The time or dwell at each magnet current step may be selected to permit one or more rotations of deflected ion beam 26 about axis 24. The number of rotations at each value of radius may be selected to achieve a desired ion dosage and dose uniformity. Steps 200a, 200b, 200c, etc., may have progressively longer times to permit an increase in the number of rotations for larger values of radius. This results from the increased beam velocity and consequent lower dose per rotation for larger values of radius, at a constant rotation speed. Alternatively or in combination with selecting the number of rotations at each radius, the rotation speed of rotating ion beam 32 may be varied to achieve a desired ion dose and dose distribution. In particular, the rotation speed may be reduced in inverse proportion to the radius of the annular ring to achieve a constant or nearly constant beam velocity with respect to wafer 40. It will be understood that it may be difficult to change rotation speed rapidly in the case where deflection device 20 has a relatively large mass.

Figure 6B:
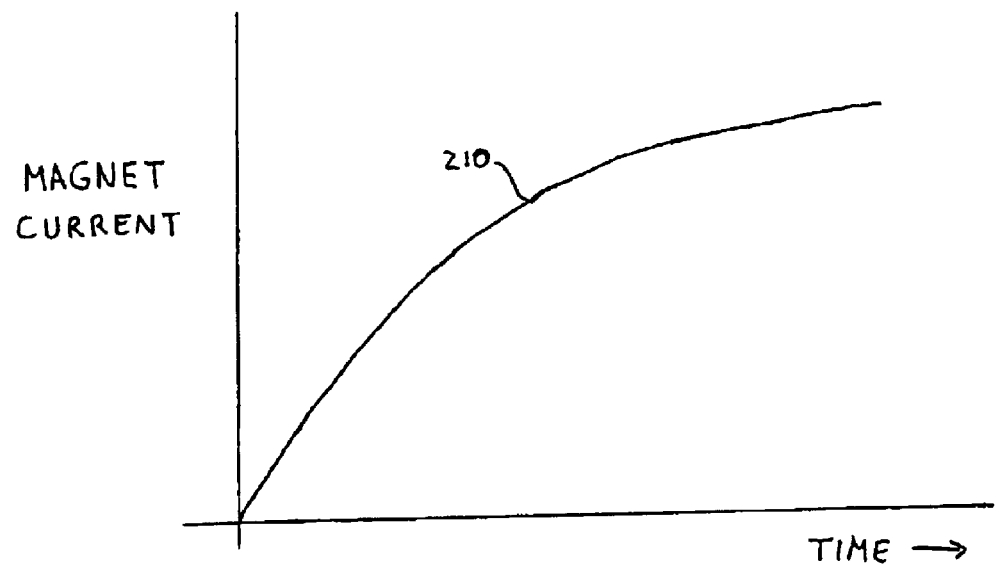
FIG. 6B is a graph of magnet current as a function of time, illustrating a magnet current waveform for moving the ion beam in a spiral pattern.

A second example of deflection magnet current as a function of time is shown in FIG. 6B. In the example of FIG. 6B, a magnet current waveform 210 increases continuously as a function of time, but at a decreasing rate. The magnet current waveform 210 moves the rotating ion beam 32 in a spiral pattern on wafer 40. The turns of the spiral pattern may overlap if desired. The magnet current may increase more slowly for larger values of magnet current to compensate for the increased circumference of the spiral turns of larger radius. In addition, the rotation speed of the deflection device 20 can be varied as a function of time.

Figure 7:
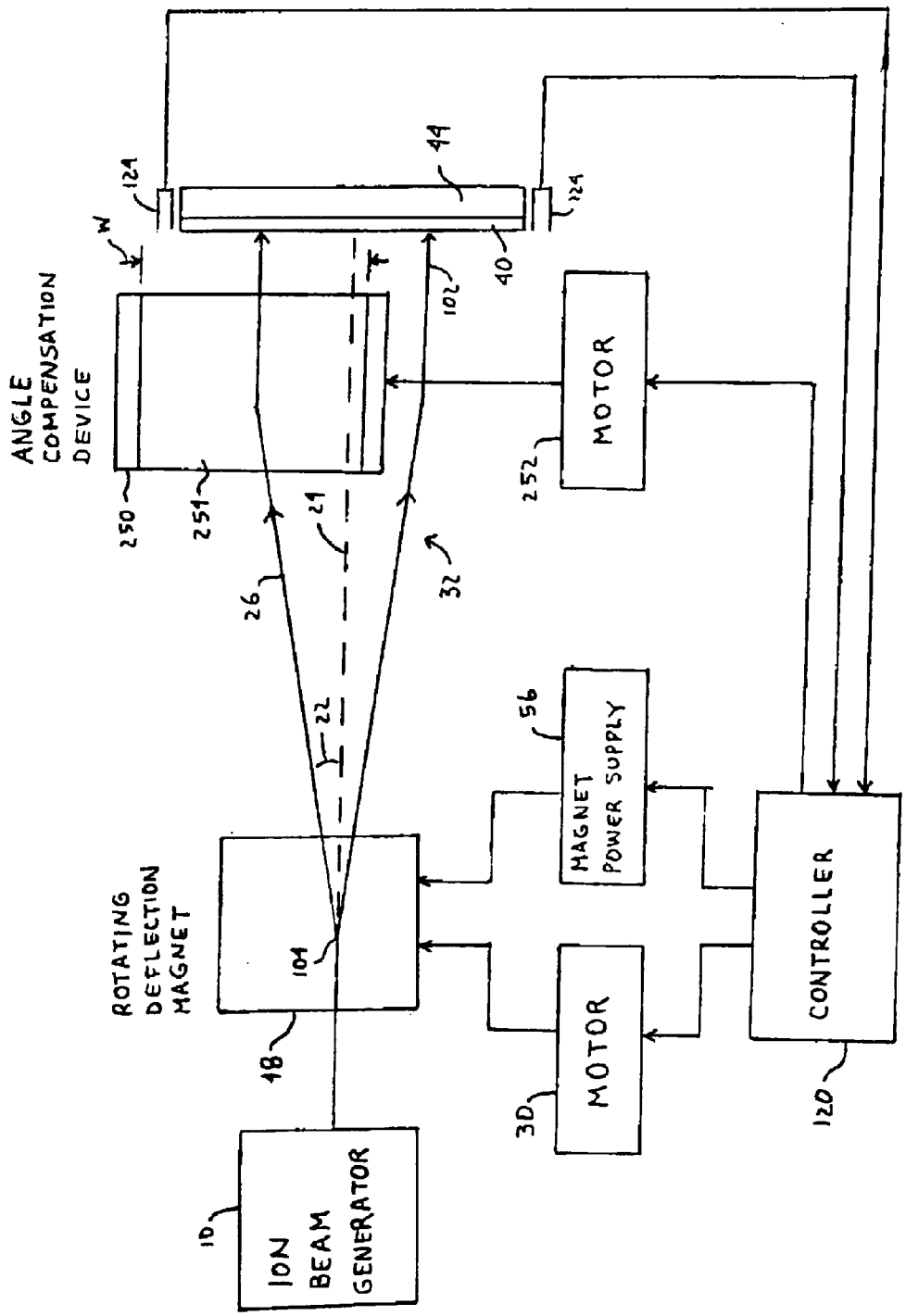
FIG. 7 is a schematic block diagram of ion implantation apparatus in accordance with a fourth embodiment of the invention.

A schematic block diagram of ion implantation apparatus in accordance with a fourth embodiment of the invention is shown in FIG. 7. Like elements in FIGS. 1–7 have the same reference numerals. In the embodiment of FIG. 7, an angle compensation device 250 is mechanically coupled to a drive device, such as a motor 252. Motor 252 produces rotation of angle compensation device 250 about axis 24. Controller 120 ensures that deflection magnet 48 and angle compensation device 250 rotate in synchronism about axis 24. Wafer 40 is stationary in the embodiment of FIG. 7.

Because angle compensation device 250 rotates in synchronism with deflected beam 26, angle compensation device 250 is not required to have an aperture that is equal in size to wafer 40. Instead, angle compensation device 250 is required to have an aperture of sufficient size to pass deflected beam 26. In some embodiments, angle compensation device 250 may have an elongated, slot-shaped aperture 254 with a width, W, at least as great as the radius of wafer 40 and a height (perpendicular to the plane of FIG. 7) at least as great as the beam diameter.

In some embodiments, angle compensation device 250 may be an angle corrector magnet having shaped polepieces separated by a gap for directing ions diverging from center of deflection 104 along parallel trajectories. The gap between the magnet polepieces corresponds to the aperture 254 in angle compensation device 250. Angle corrector magnets are disclosed by way of example in U.S. Pat. No. 4,922,106 issued May 1, 1990 to Berrian et al. In an alternative embodiment, deflection magnet 48 and angle compensation device 250 are mechanically coupled to a single drive motor.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. Apparatus for ion implantation of a workpiece, comprising:

an ion beam generator for generating an ion beam;

a deflection device for deflecting the ion beam to produce a deflected ion beam;

a drive device for rotating said deflection device about an axis of rotation to thereby cause the deflected ion beam to rotate about the axis of rotation and to produce a rotating ion beam; and a controller coupled to the deflection device for controlling and varying the deflection of the ion beam so that the rotating ion beam is distributed over the surface of the workpiece.

2. Apparatus as defined in claim 1, wherein said deflection device comprises a magnet having polepieces disposed on opposite sides of the ion beam, and a magnet winding.

3. Apparatus defined in claim 2, further comprising a power supply for supplying current to the magnet winding.

4. Apparatus as defined in claim 1, wherein said controller comprises means for moving the rotating ion beam in a pattern of concentric annular rings.

5. Apparatus as defined in claim 4, wherein the pattern of concentric annular rings comprises a circular pattern.

6. Apparatus a defined in claim 4, wherein the pattern of concentric annular rings comprises an annular pattern.

7. Apparatus as defined in claim 1, wherein said controller includes means for moving the rotating ion beam in a spiral pattern.

8. Apparatus as defined in claim 1, further comprising an angle compensation device downstream of said deflection device for directing the rotating ion beam along desired trajectories.

9. Apparatus as defined in claim 8, wherein said angle compensation device is configured for directing the rotating ion beam along parallel trajectories.

10. Apparatus as defined in claim 9, wherein said deflection device comprises a dipole magnet and wherein said angle compensation device comprises a symmetric quadrupole magnet triplet.

11. Apparatus as defined in claim 8, wherein said drive device rotates said deflection device and said angle compensation device about the axis of rotation in synchronism.

12. Apparatus as defined in claim 1, further comprising an angle compensation device for causing the rotating ion beam to have a substantially constant angle of incidence on the workpiece.

13. Apparatus as defined in claim 12, wherein the angle compensation device comprises a magnetic lens.

14. Apparatus as defined in claim 12, wherein the angle compensation device comprise an angle corrector magnet and a drive mechanism for rotating the angle corrector magnet about the axis of rotation in synchronism with the rotating ion beam.

15. Apparatus as defined in claim 12, wherein the angle compensation device comprises an electrostatic lens.

16. Apparatus as defined in claim 12, wherein the angle compensation device comprises a mechanism for tilting the workpiece in synchronism with the rotating ion beam.

17. Apparatus as defined in claim 1, wherein said deflection device comprises an electrostatic deflection device.

18. Apparatus as defined in claim 1, wherein said controller includes means coupled to the drive device for controlling rotation of the deflected ion beam about the axis of rotation.

19. Apparatus as defined in claim 1, further comprising a controller for controlling the deflection device and the drive device to distribute the rotating ion beam over a surface of the workpiece.

20. Apparatus as defined in claim 1, further comprising a controller coupled to the drive device for controlling the rotation of the deflected ion beam.

21. A method for ion implantation of a workpiece, comprising:
 generating an ion beam;
 deflecting the ion beam to produce a deflected ion beam;
 rotating the deflected ion beam about an axis of rotation to produce a rotating in beam; and
 varying the deflection of the ion beam to distribute the deflected ion beam over the surface of the workpiece.

22. A method as defined in claim 21, wherein deflecting the ion beam comprises deflecting the ion beam with a magnetic field.

23. A method as defined in claim 22, wherein rotating the deflected ion beam comprises rotating the magnetic field.

24. A method as defined in claim 21, wherein rotating the deflected ion beam comprises rotating the deflected ion beam about an axis of rotation that passes through a center of the workpiece.

25. A method claim 21, further comprises varying a rotation speed of the deflected ion about the axis of rotation.

26. A method as defined in claim 21, wherein varying the deflection of the ion beam comprises moving the ion beam in a pattern of concentric annular rings.

27. A method as defined in claim 26, wherein moving the ion beam in a pattern of concentric annular rings comprises moving the ion beam in a circular pattern.

28. A method as defined in claim 26, wherein moving the ion beam in a pattern of concentric annular rings comprises moving the ion beam in an annular pattern.

29. A method as defined in claim 26, wherein moving the ion beam in a pattern of concentric annular rings comprises moving the ion beam in a pattern of at least partially overlapping concentric annular rings.

30. A method as defined in claim 21, wherein varying the deflection of the ion beam comprises moving the ion beam in a spiral pattern.

31. A method as defined in claim 21, further comprising directing the rotating ion beam along desired trajectories.

32. A method as defined in claim 21, further comprising directing the rotating ion beam along parallel trajectories.

33. A method as defined in claim 21, further comprising causing the rotating ion beam to have a substantially constant angle of incidence on the workpiece.

34. A method as defined in claim 33, wherein causing the rotating ion beam to have a substantially constant angle of incidence on the workpiece comprises magnetically collimating the rotating ion beam with a magnetic lens.

35. A method as defined in claim 33, wherein causing the rotating ion beam to have a substantially constant angle of incidence on the workpiece comprises magnetically collimating the rotating ion beam with an angle corrector magnet and rotating the angle corrector magnet about the axis of rotation in synchronization with the rotating ion beam.

36. A method as defined in claim 33, wherein causing the rotating ion beam to have a substantially constant angle of incidence on the workpiece comprises electrostatically collimating the rotating ion beam with an electrostatic lens.

37. A method as defined in claim 33, wherein causing the rotating ion beam to have a substantially constant angle of incidence on the workpiece comprises tilting the workpiece in synchronism with the rotating ion beam.

38. A method as defined in claim 21, wherein deflecting the ion beam comprises deflecting the ion beam with an electrostatic field.

39. A method as defined in claim 21, further comprising varying the deflection of the ion beam to distribute the rotating ion beam over the workpiece, sensing the rotating ion beam and adjusting deflection of the ion beam to achieve substantially uniform distribution of the ion beam over the workpiece.

40. A method as defined in claim 21, further comprising varying the deflection of the ion beam to distribute the rotating ion beam over the workpiece, sensing the rotating ion beam and adjusting a rotation speed of the deflected ion beam to achieve substantially uniform on of the ion beam over the workpiece.

41. A method a defined in claim 31, wherein directing the rotating ion beam along desired trajectories comprises directing the rotating ion beam with a magnetic field.

42. A method as defined in claim 21, further comprising controlling one or both of deflecting the ion beam and rotating the deflected ion beam to produce a desired distribution of the rotating ion earn over a surface of the workpiece.

* * * * *